United States Patent
Manning

(10) Patent No.: US 8,472,004 B2
(45) Date of Patent: Jun. 25, 2013

(54) IMMERSION PHOTOLITHOGRAPHY SCANNER

(75) Inventor: H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 420 days.

(21) Appl. No.: 11/335,251

(22) Filed: Jan. 18, 2006

(65) Prior Publication Data

US 2007/0165199 A1    Jul. 19, 2007

(51) Int. Cl.
G03B 27/52    (2006.01)

(52) U.S. Cl.
USPC ............................................... 355/53; 355/30

(58) Field of Classification Search
USPC ............... 355/53, 30, 72, 73, 74, 76, 77, 86, 355/87, 94, 95, 96; 250/492.1
See application file for complete search history.

(56) References Cited

U.S. PATENT DOCUMENTS

| | | |
|---|---|---|
| 1,978,579 A | 10/1934 | Hooks |
| 2,221,630 A | 11/1940 | Bjorkman |
| 4,346,164 A | 8/1982 | Tabarelli et al. |
| 4,968,375 A | 11/1990 | Sato et al. |
| 5,260,174 A | 11/1993 | Nakazawa et al. |
| 5,452,053 A | 9/1995 | Nozue et al. |
| 5,559,582 A | 9/1996 | Nishi et al. |
| 5,673,208 A | 9/1997 | Meier et al. |
| 5,698,069 A | 12/1997 | Aiyer et al. |
| 5,825,470 A | 10/1998 | Miyai et al. |
| 5,828,470 A | 10/1998 | Maeda et al. |
| 5,871,584 A | 2/1999 | Tateyama et al. |
| 5,931,722 A | 8/1999 | Ohmi et al. |
| 6,038,015 A | 3/2000 | Kawata |
| 6,063,190 A | 5/2000 | Hasebe et al. |
| 6,266,132 B1 | 7/2001 | Stewart et al. |
| 6,269,517 B1 | 8/2001 | Dornier et al. |
| 6,290,863 B1 | 9/2001 | Morgan et al. |
| 6,459,473 B1 | 10/2002 | Chang et al. |
| 6,466,315 B1 | 10/2002 | Karpol et al. |
| 6,496,257 B1 | 12/2002 | Taniguchi et al. |
| 6,529,274 B1 | 3/2003 | Hickman |

(Continued)

FOREIGN PATENT DOCUMENTS

| | | |
|---|---|---|
| EP | 0268284 | 5/1988 |
| EP | 0605103 | 7/1994 |

(Continued)

OTHER PUBLICATIONS

U.S. Appl. No. 11/189,236, filed Jul. 25, 2005, Benson.

(Continued)

*Primary Examiner* — Francis M Legasse, Jr.
*Assistant Examiner* — Bao-Luan Le
(74) *Attorney, Agent, or Firm* — Perkins Coie LLP

(57) ABSTRACT

An immersion photolithography system includes a lens system positioned to focus radiation emitted from the radiation source onto a workpiece or wafer on a stage. A liquid supply system provides liquid between the lens of the lens system closest to the wafer. A seal element encloses a volume of liquid which keeps the lower or wetted surface of the lens wet. The seal element may be located at a lens parking location adjacent to the stage. The system provides an improved way for keeping the lens wet between exposure processing.

20 Claims, 4 Drawing Sheets

U.S. PATENT DOCUMENTS

| | | |
|---|---|---|
| 6,550,990 B2 | 4/2003 | Sakurai et al. |
| 6,563,568 B2 | 5/2003 | Pierrat |
| 6,624,879 B2 | 9/2003 | Imai et al. |
| 6,666,927 B2 | 12/2003 | Gindel |
| 6,682,406 B2 | 1/2004 | Chiou et al. |
| 6,809,794 B1 | 10/2004 | Sewell |
| 6,817,057 B2 | 11/2004 | Shirley et al. |
| 6,862,080 B2 | 3/2005 | Matsui et al. |
| 6,867,844 B2 | 3/2005 | Vogel et al. |
| 6,970,228 B1 | 11/2005 | Aoki et al. |
| 2003/0200996 A1 | 10/2003 | Hiatt et al. |
| 2004/0118184 A1 | 6/2004 | Violette |
| 2004/0134420 A1 | 7/2004 | Lei |
| 2004/0154530 A1 | 8/2004 | Hiatt et al. |
| 2004/0169924 A1 | 9/2004 | Flagello et al. |
| 2004/0207824 A1 | 10/2004 | Lof et al. |
| 2004/0211920 A1* | 10/2004 | Derksen et al. ............ 250/492.1 |
| 2004/0263808 A1 | 12/2004 | Sewell |
| 2005/0018155 A1 | 1/2005 | Cox et al. |
| 2005/0024609 A1 | 2/2005 | De Smit et al. |
| 2005/0028314 A1 | 2/2005 | Hickman et al. |
| 2005/0042554 A1 | 2/2005 | Dierichs et al. |
| 2005/0048220 A1 | 3/2005 | Mertens et al. |
| 2005/0078287 A1 | 4/2005 | Sengers et al. |
| 2005/0259234 A1 | 11/2005 | Hirukawa et al. |
| 2005/0264802 A1 | 12/2005 | Shibata et al. |
| 2006/0023185 A1 | 2/2006 | Hazelton et al. |
| 2006/0238731 A1* | 10/2006 | Beems et al. ................... 355/55 |
| 2007/0242242 A1* | 10/2007 | Nagasaka et al. ............... 355/53 |
| 2007/0268470 A1* | 11/2007 | Shibazaki ....................... 355/53 |
| 2008/0094590 A1* | 4/2008 | Coon .............................. 355/30 |

FOREIGN PATENT DOCUMENTS

| | | |
|---|---|---|
| EP | 1498778 | 1/2005 |
| EP | 1582924 | 10/2005 |
| EP | 1612850 | 1/2006 |
| EP | 1681597 | 7/2006 |
| EP | 1739492 | 1/2007 |
| JP | 62122132 | 6/1987 |
| JP | 63157419 | 6/1988 |
| JP | 1-171762 | 7/1989 |
| JP | 1-283930 | 11/1989 |
| JP | 5-291400 | 11/1993 |
| JP | 7-302827 | 11/1995 |
| JP | 10-223740 | 8/1998 |
| JP | 10216055 | 8/1998 |
| JP | 10-294261 | 11/1998 |
| JP | 2000-150627 | 5/2000 |
| JP | 573040 | 1/2007 |
| KR | 2003056808 | 7/2003 |
| WO | WO 2004090577 A2 * | 10/2004 |
| WO | WO-2004090956 | 10/2004 |

OTHER PUBLICATIONS

Chang, K., "When There Is Splish, but No Splash," 1 page, New York Times, Apr. 5, 2005.

U.S. Appl. No. 11/214,388, filed Aug. 29, 2005, Parekh.

U.S. Appl. No. 11/432,153, filed May 10, 2006, Hickman.

U.S. Appl. No. 11/432,160, filed May 10, 2006, Hickman.

* cited by examiner

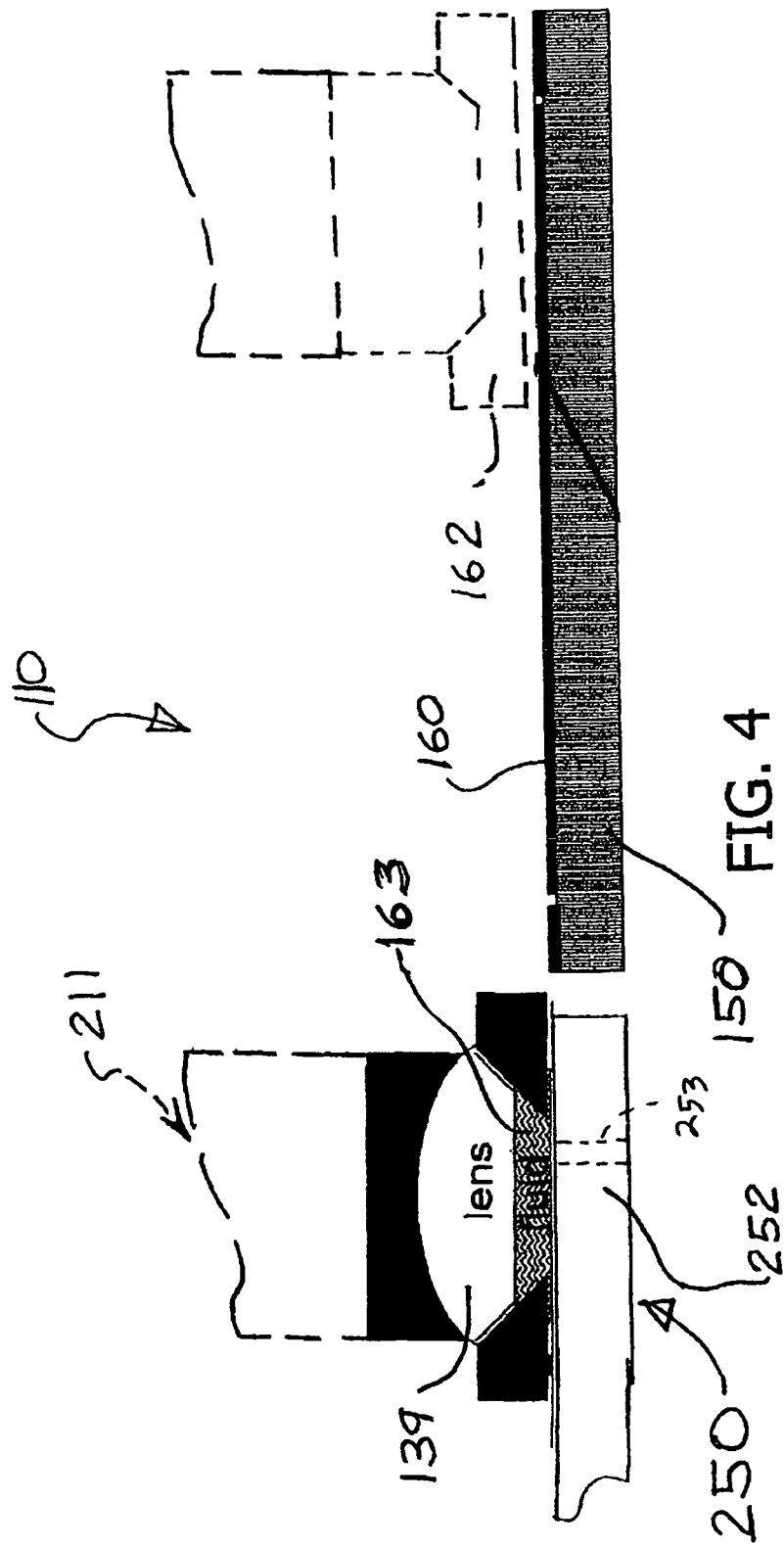

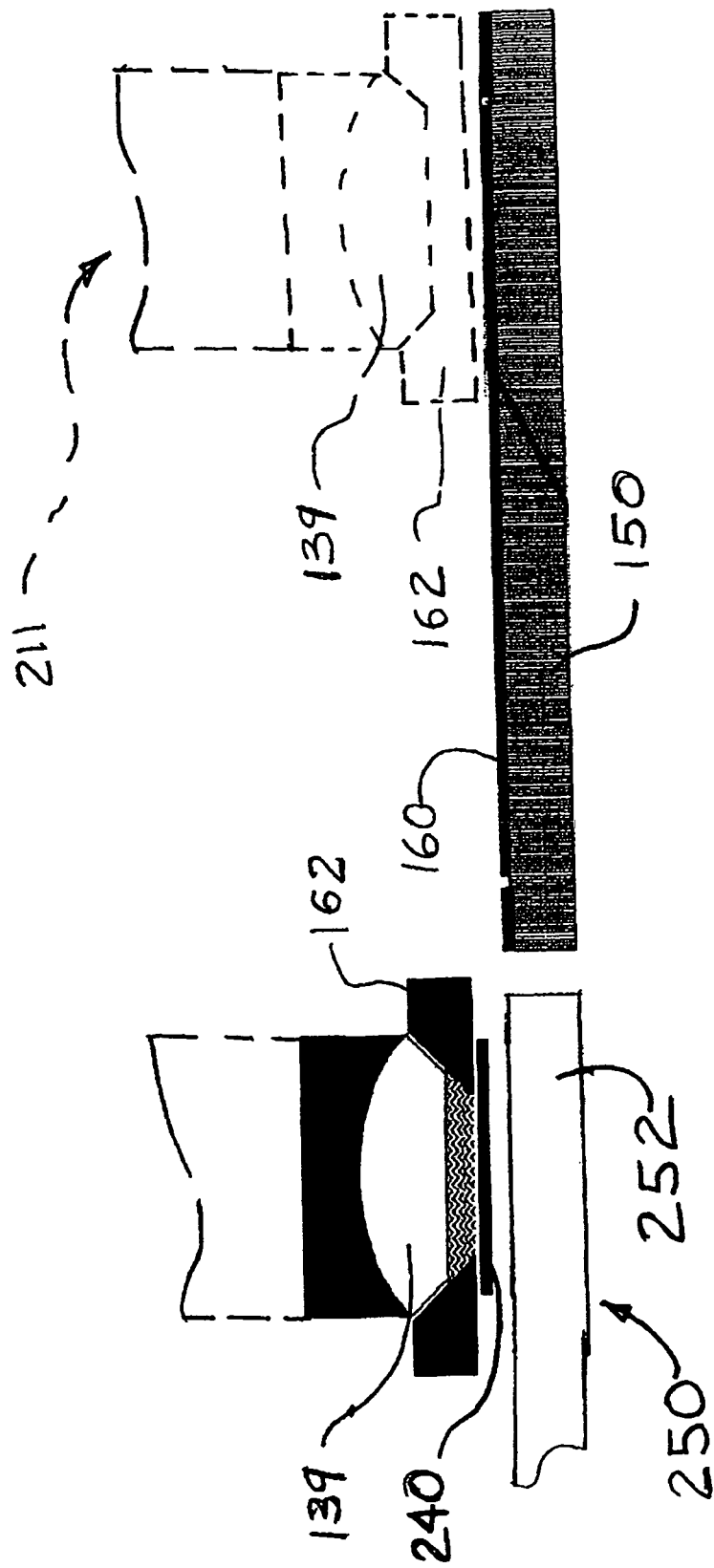

IMMERSION PHOTOLITHOGRAPHY SCANNER

TECHNICAL FIELD OF THE INVENTION

The present invention relates generally to methods and systems for immersion photolithography as used in the semiconductor device manufacturing industry.

BACKGROUND OF THE INVENTION

Microelectronic devices or features are typically formed in or on workpieces (including semiconductor wafers) by selectively removing material from the wafer and filling in the resulting openings with insulative, semiconductive and/or conductive materials. One typical process includes depositing a layer of radiation-sensitive photoresist material on the wafer, then positioning a patterned mask or reticle over the photoresist layer, and then exposing the masked photoresist layer to a selected radiation. The wafer is then exposed to a developer, such as an aqueous base liquid or a solvent. This process is generally known as photolithography.

In one photolithography process, the photoresist layer is initially generally soluble in the developer, and the portions of the photoresist layer exposed to the radiation through patterned openings in the mask change from being generally soluble to being generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to expose the wafer material below.

The wafer is then subjected to etching or metal deposition processes. In an etching process, the etchant removes exposed material, but not material protected beneath the remaining portions of the photoresist layer. Accordingly, the etchant creates a pattern of openings (such as grooves, channels, or holes) in the wafer material or in materials deposited on the wafer. These openings can be filled with insulative, conductive, or semiconductive materials to build layers of microelectronic features on the wafer. The wafer is then singulated to form individual chips, which are used in a wide variety of electronic products.

The semiconductor manufacturing industry continuously strives to make ever smaller microelectronic devices and features. Making these features smaller allows for smaller and lighter electronic products, reduces the electrical power required to operate them, and can also reduce manufacturing costs. These efforts have allowed electronic products, such as cell phones and other wireless devices, computers, PDA's etc. to be smaller and lighter, with improved battery life, and greater functionality. As the size of the microelectronic features formed in the wafer decreases (for example, to reduce the size of the chips placed in electronic devices), the size of the features formed in the photoresist layer must also decrease.

Photolithography in the semiconductor industry has traditionally used light projected through a lens system onto a substrate, such as a silicon wafer. Air or another gas fills the gap or space between the lens and the substrate. However, the air or gas between the lens, or the last lens element, and the substrate, limits the maximum resolution of the lens system. This in turn largely prevents the photolithography process from making microelectronic devices or features below a certain size. To overcome this limitation, immersion lithography machines have been proposed. These immersion stepper or scanner machines perform optical lithography with a liquid between the lens and the substrate. Since liquids, such as water, have a higher index of refraction than air or gases, better resolution can be achieved. This allows smaller devices to be manufactured.

The lens in an immersion scanner is advantageously maintained wet or immersed between uses. In current immersion scanners, a wetting unit is raised up to the lens, when the scanner is idle. The wetting unit has a set of seals to help to confine the liquid around the lens. These seals are generally different from the seal techniques used to confine the liquid around the lens when the scanner is in use. Consequently, the need for the wetting unit adds to the cost and complexity of the scanner.

BRIEF DESCRIPTION OF THE DRAWINGS

In the drawings, wherein the same reference number indicates the same element in each of the views:

FIG. 4 is a similar view showing the lens at a lens parking station, and with the lens kept wet using the same liquid supply and sealing or containment system used during exposure processing.

FIG. 5 is a similar view showing the lens at a lens parking station, and with the lens kept wet using a separate seal moved into position in alignment with the lens.

Many specific details are set forth in the following discussion and in FIGS. 1-5 to provide a thorough description. One skilled in the art, however, will understand that the invention may have additional embodiments, and that the invention may be practiced without several of the details and elements described below. The invention may reside as well in components, subcombinations or subsystems of the apparatus and methods described.

DETAILED DESCRIPTION OF THE DRAWINGS

The present disclosure describes methods and apparatus for performing immersion photolithography. The term "wafer" or "workpiece" as used includes workpieces on and/or in which microscopic circuits or components, data storage elements or layers, vias or conductive lines, micro-optic features, micromechanical features, and/or microbiological features are or can be fabricated using microlithographic techniques. In any of these embodiments, the workpiece is formed from suitable materials, including ceramics, and may support layers and/or other formations of other materials, including but not limited to metals, dielectric materials and photoresists.

The drawings and the description of them generally describe an immersion scanner having a liquid supply system which keeps the lens wet during exposure of wafers. To prevent the lens from drying between uses, the lens is moved to a storage or parking station (or the parking station is moved to the lens). The parking station may be adjacent to the stage where wafer exposure takes place. At the parking station, the same liquid supply system used during exposure of a wafer, may also be used to keep the lens wet in the parking station. The lens can remain wet without any element or component making physical contact with the lens or any component or structure around the lens. In this non-contact technique, risk of particle generation is reduced.

A seal or closing off component, such as a disk, may also be used to keep the lens wet. The seal may contact or attach to a showerhead or other structure around the lens. This contact technique may be useful e.g., where the scanner is powered down for maintenance. The seal may optionally be used at the parking station.

Figure 1:
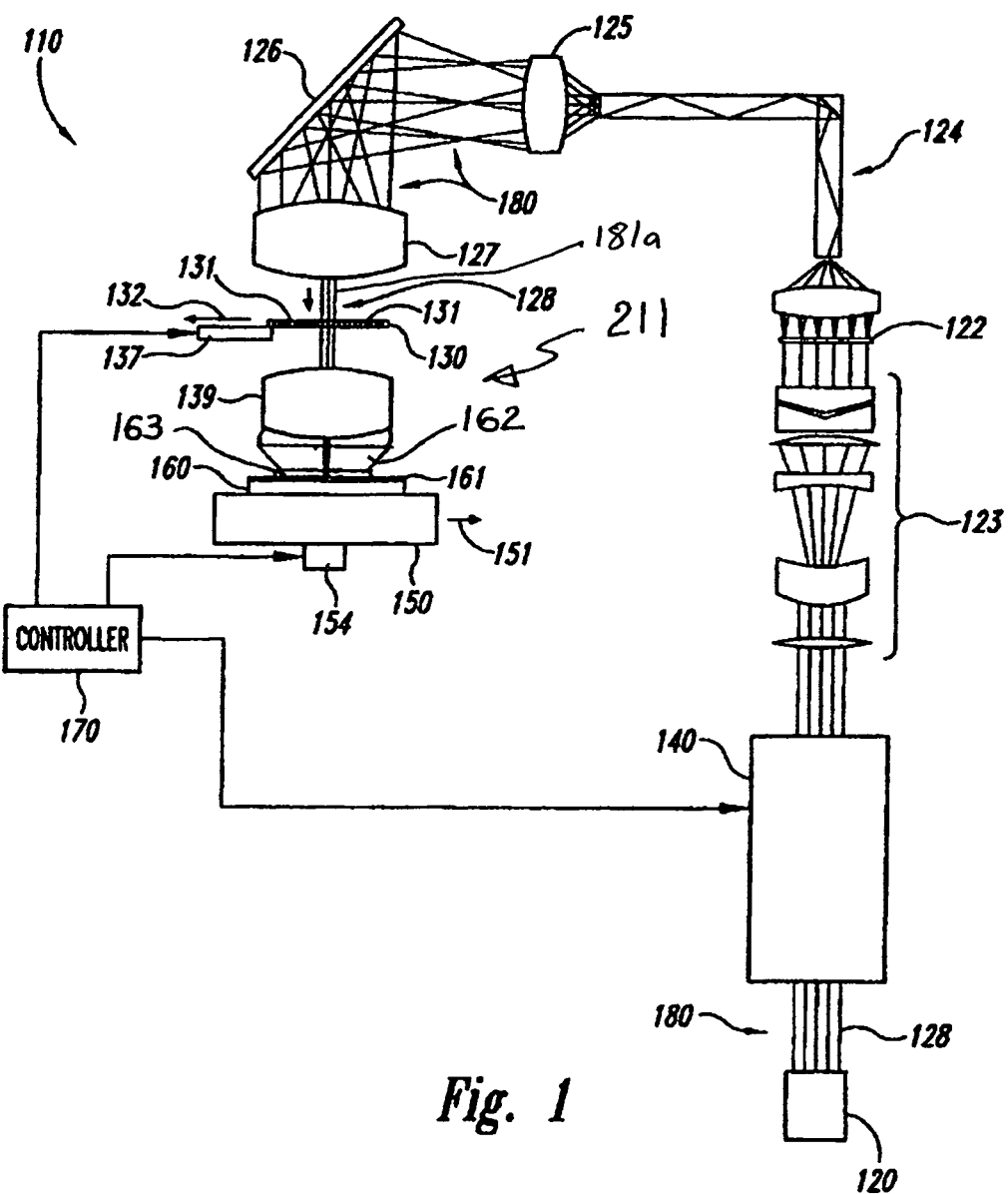
FIG. 1 is a schematic diagram of an immersion photolithography scanner.

FIG. 1 schematically illustrates an apparatus 110 for performing immersion photolithography. The apparatus 110 includes electromagnetic radiation source 120. The source may generate visible light, UV light, or other forms of electromagnetic radiation. For purposes of description here, the electromagnetic radiation will be simply referred to as light. The source 120 directs a beam of light 128 along a path 180 toward the workpiece 160. The apparatus 110 can further include an adaptive structure 140 that adjusts the characteristics of the beam 128, such as spatial distribution of amplitude (intensity), phase, and/or polarization across the beam 128.

Optionally, the beam 128 can then pass through a lens system 123 configured to shape and/or magnify the light beam. Optionally, the apparatus 110 can further include a diffractive element 122 to diffuse the light beam 128, and/or a light tube 124 positioned to generate a plurality of images of the light source 120. The light tube 124 and/or or a sizing lens 125 can size the beam 128, which can then be directed by a mirror 126 through a focusing lens 127 to a reticle or mask 130 along a reticle radiation path segment 181a.

The reticle 130 can include reticle apertures 131 through which the beam passes to form an image on the workpiece 160. The light can pass through a reduction lens 139 which reduces the image pattern defined by the reticle to a size corresponding to the size of the features to be formed on the workpiece 160. A liquid supply element 162, often referred to as a showerhead, provides a layer of liquid 163, such as water, between the lens 139 and the workpiece 160. The beam 128 passes through the lens 139 and through the liquid 163, and then impinges on a radiation-sensitive or light sensitive material 161 (e.g., a photoresist layer) on the workpiece 160 to form an image on the material 161. Since the liquid 163 has a higher index of refraction than air, better resolution can be achieved by having the beam 128 pass through the liquid 163 rather than air or another gas.

In one embodiment, the beam 128 impinging on the material 161 can have a generally rectangular shape with a width of from about 5 mm. to about 8 mm. and a length of about 26 mm. In other embodiments, the beam 128 incident on the layer 161 can have other shapes and sizes. In one embodiment, the radiation of light can have a wavelength selected from the following values: 13 nanometers, 157 nanometers, 193 nanometers, 248 nanometers and 365 nanometers. In other embodiments, the wavelength can have a value below, above or between these values, provided the wavelength is suitable for exposing the material 161 on the workpiece 160.

Referring still to FIG. 1, the workpiece 160 can be carried by a workpiece support 150. In one embodiment (a scanner arrangement), the workpiece support 150 moves along a workpiece support path 151, and the reticle 130 moves in the opposite direction along a reticle path 132 to scan the image produced by the reticle 130 across the material 161 while the position of the beam 128 remains fixed. Accordingly, the workpiece support 150 can be coupled to a support actuator 154 and the reticle 130 can be coupled to a reticle actuator 137.

As the reticle 130 moves opposite the workpiece 160, the radiation or light source 120 can flash to irradiate successive portions of the workpiece 160 with corresponding successive images produced by the reticle 130, until an entire field of the workpiece 160 is scanned. The flash rate may vary. For example, the source 120 may flash at a rate of about 20 cycles during the time required for the microlithographic workpiece 160 to move by one beam width (e.g., by from about 5 mm. to about 8 mm.). The source 120 can flash at the same rate throughout the scanning process (assuming the reticle 130 and the workpiece 150 each move at a constant rate) to uniformly irradiate each field. The source 120 can alternatively deliver a continuous beam 128. Regardless of the flash rate or duration, generally each field can include one or more dice or chips, and/or other features.

In another embodiment (a stepper arrangement), the beam 128 and the reticle 130 can expose an entire field of the workpiece 160 in one or more flashes, while the reticle 130 and the workpiece support 150 remain in a fixed transverse position relative to the light path 180. After the field has been exposed, the reticle 130 and/or the workpiece support 150 can be moved transverse to the path 180 to align other fields with the beam 128. This process can be repeated until each of the fields of the workpiece 160 is exposed to the beam 128.

A controller 170 can be linked to the reticle 130 or the reticle actuator 137, and the workpiece support 150 or the support actuator 154. Accordingly, the controller 170 can include a processor, microprocessor or other device that can automatically (with or without user input) control and coordinate the relative movement between these elements. The controller 170 can also be coupled to the adaptive structure 140 to control the characteristics of the radiation beam 128.

Figure 2:
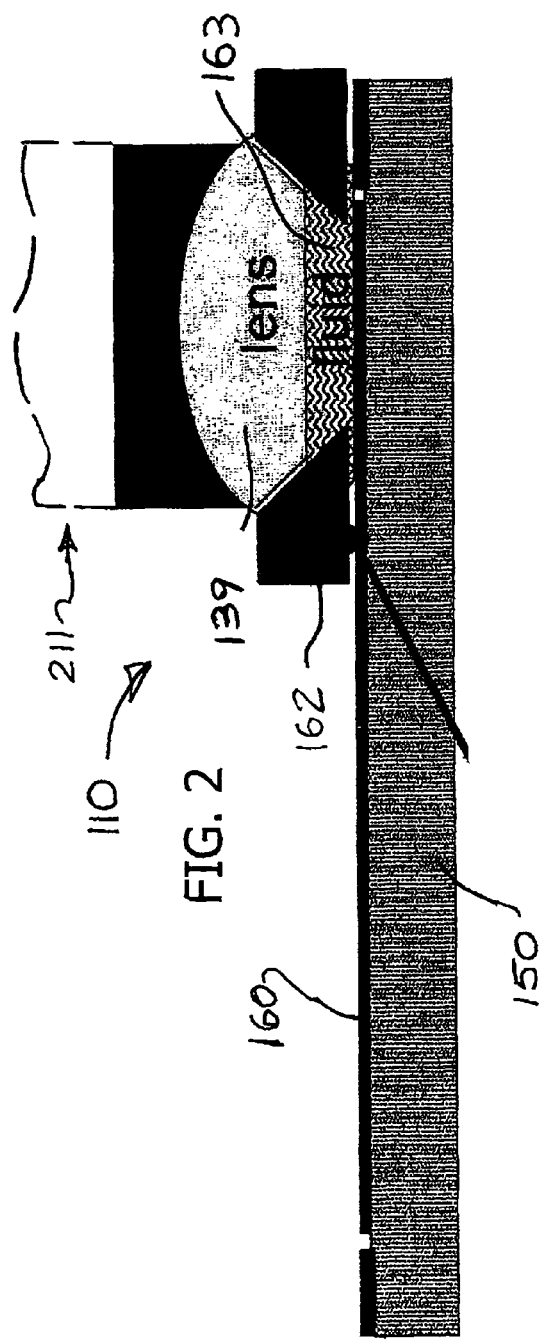
FIG. 2 is a schematic section view of elements of the immersion scanner of FIG. 1, shown during exposure of a wafer.

The light source and lens exposure system, generally designated as 211, is necessarily idle during certain intervals, for example, when the stage is exchanging wafers or conducting calibration. However, during these idle intervals, as well as during other times when the scanner 110 is idle, it is advantageous to keep the lens 139 wet. During exposure, in existing scanners, the lens 139 remains wet due to the design and operation of the scanner. Specifically, liquid under pressure flows from the shower head 162 and fills the space or gap between lens and the wafer, keeping the lens 139 wet. The lens 139 and the rest of the exposure system 211 may be above the wafer 160, as shown in FIG. 2, or they may be inverted, with the exposure system projecting up from below.

Figure 3:
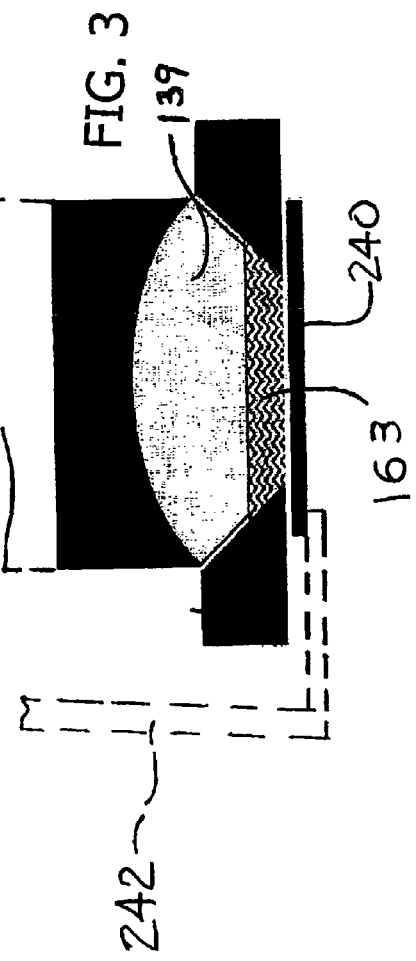
FIG. 3 is a schematic section view of the immersion scanner of FIG. 2, when the scanner is between wafers or otherwise idle, with a seal in place to keep the lens wet.

FIG. 3 shows seal 240 for use to keep the lens 139 wet when the system 110 is not exposing a wafer. The seal 240 may be generally flat disk or surface. The seal may be moved into position over (i.e., aligned with) the lens 139 by a positioner 242. The seal 240 may or may not make physical contact with the shower head 162 or any other system component. In designs where the seal 240 makes physical contact, sealing elements, such as rings, may be provided, to seal liquid within the space around the lens 139 by making a physical barrier. In non-contact designs, the seal 240 (or the shower head 162) may use gas flow to confine the liquid at the lens. The design shown in FIG. 3 may be used at a parking station, or at another location.

In FIG. 4, the exposure system 211 is shown in dotted lines at an exposure or processing position over a wafer 160 supported on a stage 150. A parking location 250 is positioned to one side of the stage. A parking platform or surface 252 is provided at the parking position, optionally vertically aligned with the wafer 160. The surface 252 may be a wafer section.

When the scanner 110 is not in use exposing a wafer 160, the lens 139 may be moved into the parking or idle position 250. At the parking position 250, the shower head 162 may continue to operate to provide liquid keeping the lens 139 wet. The parking surface 252 at the parking location cooperates with the shower head to keep the lens wet, by providing a lower surface for blocking or confining the liquid. As the parking location is adjacent to the stage, and optionally at the same level as the stage, less relative movement within the scanner 110 is needed to keep the lens wet during idle periods. The parking surface 252 may optionally include a drain 253 to remove liquid.

FIG. 5 shows another alternative design using a seal element 240 and a parking station 250. Since the seal element provides the sealing function, the parking platform or surface 252 may be omitted. The seal 240 shown in FIG. 5 may be designed and operated in the same way as the seal element 240 shown in FIG. 3 and described above.

The term seal or seal element as used here means an element that helps to confine liquid or to control movement of liquid. Perfect sealing, i.e., preventing escape of any liquid from a specific location, is not required.

Thus, novel systems and methods have been shown and described. Various changes and substitutions can of course be made without departing from the spirit and scope of the invention. The invention, therefore, should not be restricted, except by the following claims, and their equivalents.

The invention claimed is:

1. An immersion photolithography system, comprising:
an electromagnetic radiation source;
a lens system positioned to focus radiation emitted from the radiation source, with the lens system including a first lens;
a workpiece support positionable into alignment with the first lens to allow radiation emitted by the radiation source and focused by the first lens to impinge on a workpiece;
a liquid supply system for providing liquid between the first lens and the workpiece, the liquid supply system includes a liquid supply housing associated with the first lens, the liquid supply housing including an exit opening through which the liquid passes to contact the workpiece; and
a seal element for enclosing a volume of liquid which maintains at least one surface area of the first lens wet, the seal element includes a plate having one or more resilient seal rings adapted to seal against a surface of the liquid supply housing, wherein the seal element is configured as a physical barrier confining liquid onto the first lens when the one or more resilient seal rings contact the liquid supply housing to form one or more liquid tight seals surrounding the exit opening of the liquid supply housing.

2. The system of claim 1 wherein the seal element is moveable from a first position, wherein the seal element does not make physical contact with the liquid supply housing, to a second position, wherein the seal element contacts the liquid supply housing to confine liquid onto the first lens.

3. The system of claim 1 wherein the electromagnetic radiation source comprises a light source.

4. The system of claim 1 wherein the one or more resilient seal rings and the plate define a chamber that contains liquid that has passed through the exit opening when the seal element contacts the liquid supply housing.

5. An immersion photolithography system, comprising:
a light source;
a lens system positioned to focus light from the light source, with the lens system including a first lens;
at least one wafer stage;
a liquid supply system for providing liquid between the first lens and the wafer stage;
a lens parking station adjacent to the wafer stage and including a drain; and
a drive system for moving the first lens relative to the wafer stage and the lens parking station; and
wherein the first lens is moveable from a position over or under the wafer stage, to a position over or under the drain of the lens parking station, wherein the lens parking station includes a surface configured as a physical barrier to confine liquid onto the first lens and an inlet of the drain positioned along the surface of the lens parking station, the drain being configured to remove liquid contained between the first lens and the surface of the lens parking station.

6. The system of claim 5 with the liquid supply system having a liquid pressure controller for controlling pressure of the liquid, for holding the liquid in place.

7. The system of claim 5 wherein the inlet is positioned along the surface of the lens parking station and is at substantially the same vertical level as a surface of a wafer located at the at least one wafer stage.

8. The system of claim 5 wherein the surface of the lens parking station confines liquid between the lens parking station and the liquid supply system while liquid is removed using the drain.

9. The system of claim 5 wherein the drive system is configured to position the first lens over or under the drain of the lens parking station to establish fluid communication between the drain and the liquid supply system and is configured to move the first lens away from the drain to position the first lens over or under the at least one wafer stage.

10. Immersion photolithography, comprising:
forming a feature on a wafer by passing light through a lens and through a liquid between the lens and the wafer;
moving the wafer and the lens relative to each other;
keeping the liquid in contact with the lens while forming the feature;
moving a seal element to a position adjacent to the lens, after forming the feature on the wafer, with the seal element including a plate having one or more resilient seal rings contacting a surface around the lens to define a physical barrier keeping liquid in contact with the lens;
providing liquid from a liquid supply housing around the lens; and
moving the one or more resilient seal rings onto the liquid supply housing to form at least one liquid tight seal such that liquid that has exited the liquid supply housing is contained between the seal element and the liquid supply housing to keep the lens wet during idle periods.

11. The method of claim 10 wherein the liquid is kept in contact with the lens while forming the feature on the wafer, by one or both of controlling pressure of the liquid and by using a flow of gas.

12. The method of claim 10 further including moving the lens to a parking location and keeping the lens wet at the parking location.

13. The method of claim 12 further comprising moving the seal element into a position substantially covering the lens, at the parking location.

14. The method of claim 12 wherein the lens is moved only substantially horizontally.

15. An immersion photolithography system, comprising:
radiation means for providing electromagnetic radiation;

focus means for focusing radiation emitted from the radiation means;

workpiece support means for supporting a workpiece while the workpiece is exposed to radiation emitted by the radiation means and focused by the focus means;

liquid supply means for providing liquid to the workpiece, the liquid supply means includes an annular liquid supply housing associated with the focusing means, the annular liquid supply housing defining an exit opening through which liquid passes towards the workpiece; and liquid enclosing means for enclosing a volume of liquid which maintains at least one surface of the focus means wet, the liquid enclosing means includes a plate having a resilient seal ring adapted to seal against a surface of the liquid supply housing to form a liquid tight seal about the exit opening, wherein the liquid enclosing means is configured as a physical barrier to maintain the at least one surface of the focus means wet when the resilient seal ring contacts the liquid supply housing.

16. The system of claim 15 wherein the liquid enclosing means is moveable from a first position, wherein the liquid enclosing means does not make physical contact with the liquid supply housing, to a second position, wherein the liquid enclosing means contacts the liquid supply housing to enclose liquid.

17. The system of claim 15 wherein the radiation means comprises a light source and the focusing means comprises one or more transparent lenses.

18. In an immersion photolithography system of the type having an electromagnetic radiation source, and a lens system positioned to focus radiation emitted from the radiation source, and a workpiece support positionable into alignment with the lens system, to allow radiation emitted by the radiation source and focused by the lens system to expose a workpiece, a liquid supply system for providing liquid between the lens system and the workpiece, and the liquid supply system including a delivery ring supported on the lens system, the improvement comprising a lens wetting station adjacent to the workpiece support, with the lens wetting station including lens wetting means for keeping at least one part of the lens system wet, when the immersion photolithography system is idle, wherein the lens wetting means includes a plurality of concentric resilient rings configured to contact the delivery ring to enclose a volume of liquid when the lens wetting means overlays an exit opening of the delivery ring.

19. The system of claim 18 wherein the plurality of concentric resilient rings are moveable from a first position, wherein the plurality of concentric resilient rings are spaced apart from the liquid delivery ring to a second position, wherein the plurality of concentric resilient rings contact the liquid delivery ring.

20. The system of claim 18 wherein the lens system is substantially stationary and further including a workpiece support actuator for moving the workpiece support relative to the lens system.

* * * * *